United States Patent [19]

Nakayama

[11] Patent Number: 4,599,572
[45] Date of Patent: Jul. 8, 1986

[54] VOLTAGE ADDER CIRCUIT

[75] Inventor: Kazuaki Nakayama, Tokyo, Japan

[73] Assignee: Pioneer Electronic Corporation, Tokyo, Japan

[21] Appl. No.: 558,237

[22] Filed: Dec. 5, 1983

[30] Foreign Application Priority Data

Dec. 3, 1982 [JP] Japan ................................. 57-211381

[51] Int. Cl.⁴ ............................................. H03F 3/45
[52] U.S. Cl. ..................................... 330/69; 307/498; 330/255; 330/257; 330/260; 330/300
[58] Field of Search .................. 330/69, 252, 255, 257, 330/260, 300; 307/494–496, 498; 328/159; 364/768, 769, 807

[56] References Cited

U.S. PATENT DOCUMENTS 3,178,651  4/1965  Kegelman .............................. 330/69

*Primary Examiner*—James B. Mullins
*Attorney, Agent, or Firm*—Sughrue, Mion, Zinn Macpeak & Seas

[57] ABSTRACT

A voltage adder circuit for adding both balanced and unbalanced input signals. The balanced input signal is applied to respective transistors of a differential transistor pair, while the unbalanced input is applied to the emitter of an input transistor having a base-collector connected across the load of one side of the differential transistor pair. The output is taken from the load on the other side of the differential transistor pair, at the emitter of an output transistor having a base-collector coupled across the second load. The voltage adder at a circuit of the present invention may further be used in a low-distortion transistor circuit.

9 Claims, 7 Drawing Figures

VOLTAGE ADDER CIRCUIT

BACKGROUND OF THE INVENTION

The present invention relates to a voltage adder circuit. A conventional voltage adder circuit, as shown in FIG. 1, employs a parallel feedback path around an operational amplifier A. More specifically, input terminals $IN_1$, $IN_2$ and $IN_3$ are connected through corresponding resistors $R_1$, $R_2$ and $R_3$ to an inverting input terminal of the amplifier A. Parallel negative feedback from an output terminal OUT is provided through a resistor $R_4$. In the circuit of FIG. 1, the output voltage $V_o$ is:

$$V_o = R_4(V_{i1}/R_1 + V_{i2}/R_2 + V_{i3}/R_3). \quad [1]$$

This circuit forms an adder for $V_{i1}$, $V_{i2}$ and $V_{i3}$. However, this circuit cannot be used in the case where all the inputs $V_{i1}$, $V_{i2}$ and $V_{i3}$ are supplied in balanced form where the levels may float with respect to the ground level.

In view of this drawback, it is an object of the invention to provide a voltage adder circuit which functions as an adder even for balanced inputs which float with respect to ground level.

SUMMARY OF THE INVENTION

Fulfilling the above and other objects, the invention provides a voltage adder circuit including at least one differential transistor pair receiving a balanced input and an input transistor receiving an unbalanced input and having a base-collector connected across a load of one side of the differential transistor pair. The output of the circuit is taken across the load of the other side of the differential transistor pair, preferably, through an emitter-follower circuit. To accept further balanced inputs, plural differential transistor pairs can be provided, with the corresponding transistors of each pair connected in parallel with the transistors of other ones of the differential pairs. Separate current sources may be provided for each differential transistor pair to thereby permit free DC level shifting between the various balanced inputs. Further, in another preferred embodiment, inverted-Darlington-connector transistors can be provided for the transistors of the differential pair to improve the linearity of the transconductance of the circuit. Further, the circuit may be constructed as a complementary, symmetric circuit to widen the dynamic operational range of the circuit. The invention finds particularly advantageous use in distortion reducing circuits.

DESCRIPTION OF THE PREFERRED EMBODIMENTS

The invention will now be described with reference to the drawings.

Figure 1:
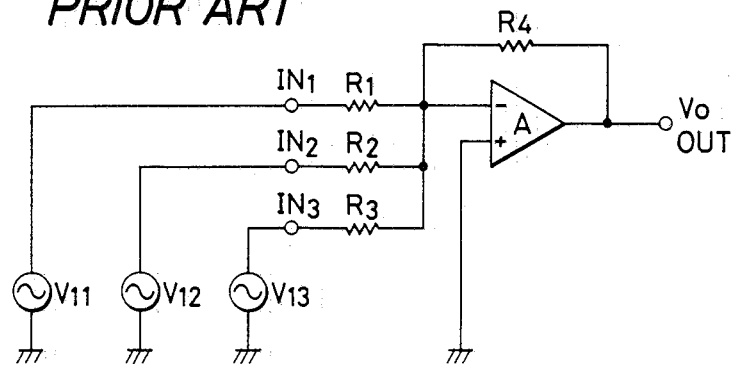
FIG. 1 is a circuit diagram showing a conventional adder circuit.
Figure 2:
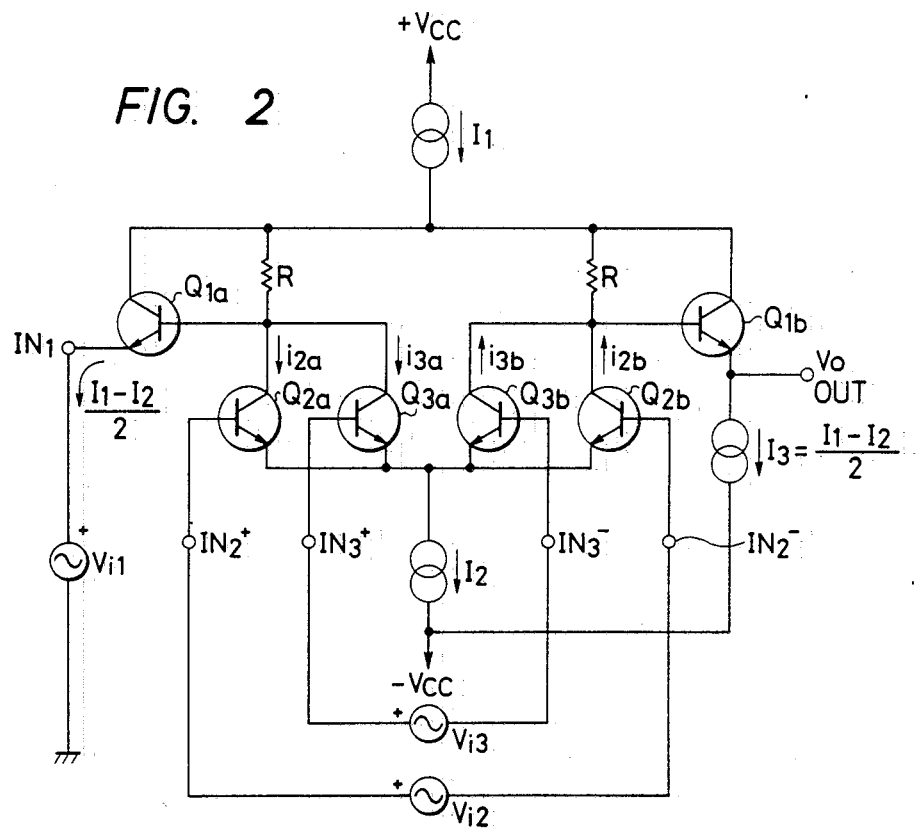
FIGS. 2 to 5 are circuit diagrams showing preferred embodiments of adder circuits of the invention.

FIG. 2 is a circuit diagram of a preferred embodiment of a voltage adder circuit constructed according to the invention. In this figure, transistors $Q_{1a}$ and $Q_{1b}$ form a voltage generator. The collectors of the transistors $Q_{1a}$ and $Q_{1b}$ are connected mutually, and a resistor R is connected between the commonly connected collectors and the base of each transistor. Transistors $Q_{2a}$ and $Q_{2b}$ and transistors $Q_{3a}$ and $Q_{3b}$ form respective differential amplifiers. The collectors of the transistors $Q_{2a}$ and $Q_{3a}$ are connected to the base of the transistor $Q_{1a}$, and the collectors of the transistors $Q_{2b}$ and $Q_{3b}$ are connected to the base of the transistor $Q_{1b}$. The bases of the transistors $Q_{2a}$ and $Q_{2b}$ are connected to a second terminal pair $IN_{2+}$ and $IN_{2-}$ at which is received a first balanced input, the base of the transistors $Q_{3a}$ and $Q_{3b}$ are connected to a third terminal pair $IN_{3+}$ and $IN_{3-}$ at which is received a second balanced input, and the emitter of the transistor $Q_{1a}$ is connected to a first terminal $IN_1$ for receipt of an unbalanced input. The adder output is taken at the emitter of the transistor $Q_{1b}$. Further, to the collectors of the transistors $Q_{1a}$ and $Q_{1b}$ and to the commonly connected emitters of the transistors $Q_{2a}$, $Q_{2b}$, $Q_{3a}$ and $Q_{3b}$, are connected DC current sources $I_1$ and $I_2$, respectively.

With this circuit arrangement, the adder circuit is completely floated from ground. Moreover, by the provision of a DC current source $I_3$, a current nearly equal in value to $(I_1 - I_2)/2$ is caused to pass through the transistor $Q_{1b}$, while the remainder of $(I_1 - I_2)/2$ is caused to pass through the transistor $Q_{1a}$ and to flow to the signal source $V_{i1}$, thereby maintaining circuit balance. Here, $V_{i2}$ and $V_{i3}$ indicate balanced AC signal sources.

In the arrangement described above, assuming the characteristics of transistors $Q_{1a}$, $Q_{1b}$, $Q_{2a}$, $Q_{2b}$, $Q_{3a}$ and $Q_{3b}$ are uniform, and denoting the transconductances of the transistor pairs $Q_{2a}$, $Q_{2b}$ and $Q_{3a}$, $Q_{3b}$ by $gm_2$ and $gm_3$, respectively, the AC adder output voltage $V_o$ is:

$$V_o = V_{i1} + (i_{2a} + i_{3a})R + (i_{2b} + i_{3b})R, \quad [2]$$

where, $(i_{2a} + i_{2b})/V_{i2} = gm_2$, $(i_{3a} + i_{3b})/V_{i3} = gm_3$. Equation [2] can be rewritten as follows:

$$V_o = V_{i1} + R(gm_2 V_{i2} + gm_3 V_{i3}). \quad [3]$$

From equation [3] it may be seen that the circuit shown in FIG. 2 functions as an adder with respect to $V_{i1}$, $V_{i2}$ and $V_{i3}$.

As is clear from equation [3], the circuit shown in FIG. 2 is constructed in such a way that, with multiplication by a certain gain, the balanced inputs $V_{i2}$ and $V_{i3}$ are serially added to the unbalanced input $V_{i1}$. Therefore, because the output currents of the transistors $Q_{2a}$, $Q_{2b}$, $Q_{3a}$ and $Q_{3b}$ caused by $V_{i2}$ and $V_{i3}$ are difference currents, it is clear that the inputs $V_{i2}$ and $V_{i3}$ do not have any effect upon the input $V_{i1}$. Thus, the inputs $V_{i1}$ to $V_{i3}$ are completely isolated from one another.

Figure 3:
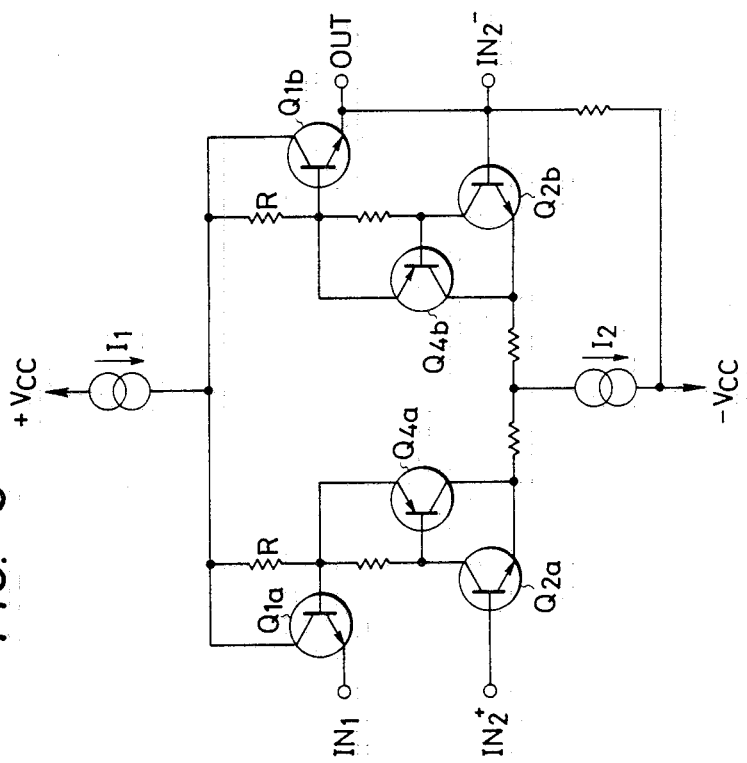

FIG. 3 shows another embodiment of the invention where a differential amplifier is provided with 100% negative feedback by inverted-Darlington-connected transistors $Q_{4a}$ and $Q_{4b}$. In this circuit, the linearity of the transconductance gm is improved remarkably.

Figure 4:
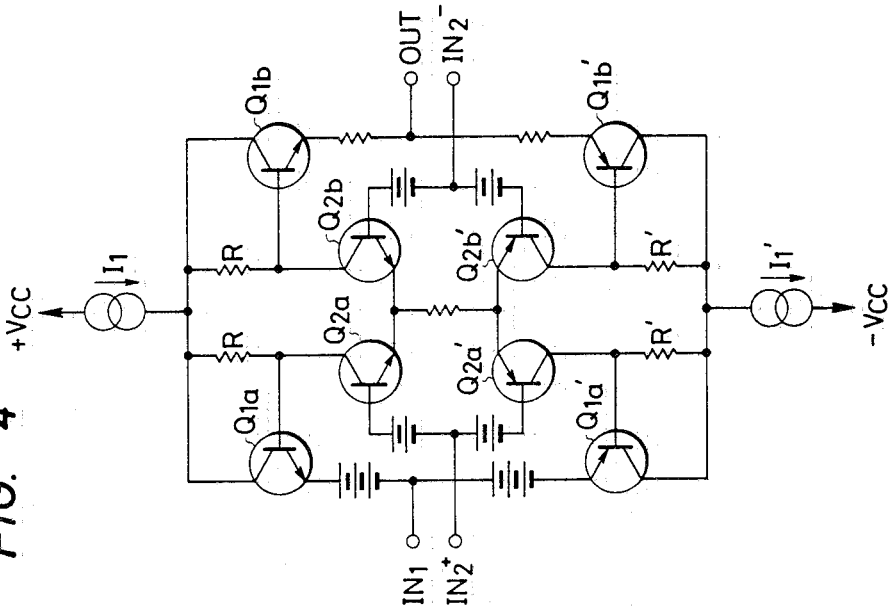

FIG. 4 shows still another embodiment of the invention where transistors $Q_{1a'}$, $Q_{1b'}$, $Q_{2a'}$, and $Q_{2b'}$, resistors R' and associated components are added to form a complementary symmetric circuit. In this embodiment, the dynamic operational range relative to the second terminals $IN_{2+}$ and $IN_{2-}$ is expanded. While a single balanced input is shown (i.e., the second terminal pair), as in the case of the embodiment of FIG. 3, it should be understood that circuit elements related to the third input terminal pair $IN_{3+}$ and $IN_{3-}$ shown in FIG. 2 can be added.

Figure 5:
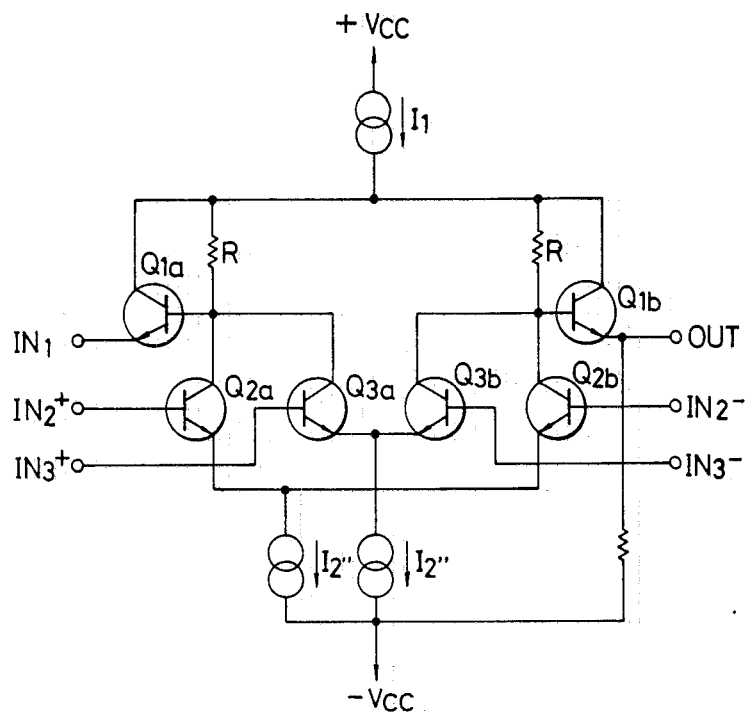

FIG. 5 shows another embodiment of the invention which is a modification of the circuit shown in FIG. 2. More specifically, the constant current source $I_2$ of FIG. 2 is divided into two sources and the divided independent current sources $I_{2'}$ and $I_{2''}$ are provided for the respective differential amplifiers. In this modified circuit, there is no restriction upon DC level shifting of each input.

In addition to the foregoing embodiments, it is also possible to modify the voltage generator and the differential amplifier to form a cascade connection or multistage Darlington connection. Further, the input impedance can be increased by the addition of an FET source follower.

The voltage adder circuit as described hereinabove is applicable, in addition to its more general application as an adder circuit, to a subtractor circuit, an error amplifier, a distortion reducing circuit and the like. Further, by manufacturing the subject circuit as an integrated circuit, a high performance adder with multiple inputs can be produced at a low cost.

Figure 6:
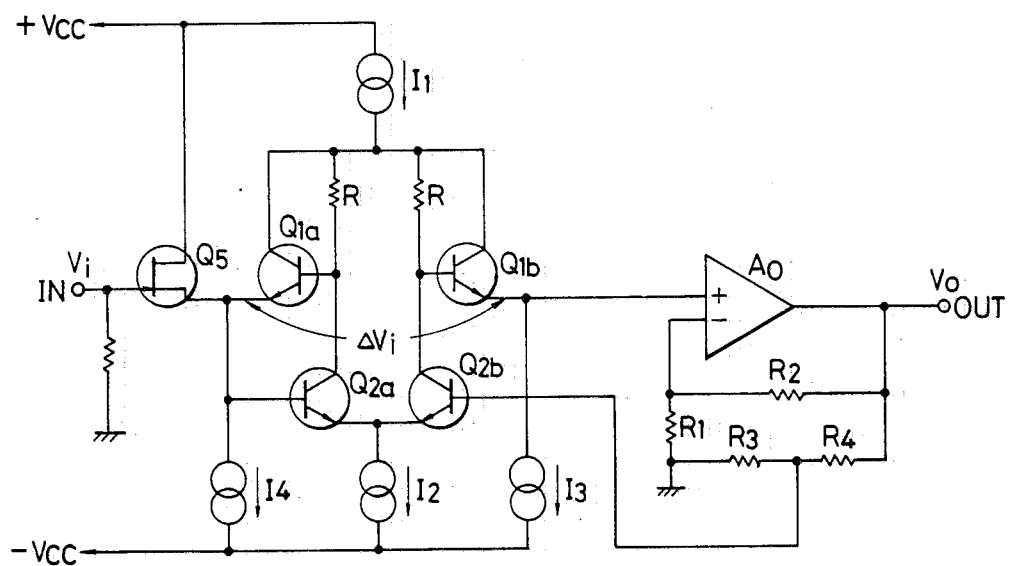
FIG. 6 is a circuit diagram showing an exemplary application of the circuits according to the invention.

FIG. 6 shows an exemplary application of the invention in a distortion reducing circuit. In this circuit, $R_1/R_2 \cong R_3/R_4$. Thus, the transistors $Q_{2a}$ and $Q_{2b}$ amplify only the distortion component generated by the amplifier $A_o$, which amplified component is added serially to the input voltage $V_i$ by the voltage generator circuit formed by the transistors $Q_{1a}$ and $Q_{1b}$ and the result fed back. In this circuit, the distortion is remarkably reduced.

In order to obtain an overall gain $A_F$, assuming:
$R_1/(R_1+R_2) = \beta$ and $R_3/(R_3+R_4) = K$, $$V_o = (V_i + \Delta V_i) \cdot \left( \frac{A_o}{1 + A_o \cdot \beta} \right), \text{ and} \quad [4]$$

$$\Delta V_i = (V_i - K \cdot V_o) gm \cdot R, \quad [5]$$

where gm is the transconductance of the transistors $Q_{2a}$ and $Q_{2b}$. From equations [4] and [5] the following is obtained:

$$V_o = \{V_i + (V_i - K \cdot V_o) gm \cdot R\} \left( \frac{A_o}{1 + A_o \cdot \beta} \right). \quad [6]$$

With the gain $A_F$ defined as $A_F = V_o/V_i$, $A_F$ may be written as follows:

$$A_F = \{1 + (1 - K \cdot A_F) gm \cdot R\} \cdot \left( \frac{A_o}{1 + A_o \cdot \beta} \right), \quad [7]$$

$$A_F = \frac{1 + gm \cdot R}{\frac{1 + A_o \cdot \beta}{A_o} + K \cdot gm \cdot R}. \quad [8]$$

Assuming that $1 << A_o \cdot \beta$ and $1 << gm \cdot R$:

$$A_F = \frac{gm \cdot R}{\beta + K \cdot gm \cdot R} = \frac{1}{\frac{\beta}{gm \cdot R} + K}. \quad [9]$$

Assuming further that $\beta/gm \cdot R << K$:

$$A_F = \frac{1}{K} = 1 + \frac{R_4}{R_3}. \quad [10]$$

Accordingly, it can be seen that the gain $A_F$ is determined by the ratio of the resistances $R_3$ and $R_4$, irrespective of the factor $A_o/(1+A_o\beta)$, which is the closed-loop gain of the amplifier $A_o$. In other words, the overall distortion is suppressed to a very low level, even if the amplifier $A_o$ generates a large amount of distortion.

By setting $A_o/(1+A_o\beta) = A_{oF}$ and $1 << gm \cdot R$, equation [8] becomes:

$$A_F = \frac{A_{oF} \cdot gm \cdot R}{1 + A_{oF} \cdot K \cdot gm \cdot R}. \quad [11]$$

Defining a distortion suppression factor F as:

$$F = 1 + A_{oF} \cdot K \cdot gm \cdot R, \quad [12]$$

and by assuming:

$$A_{oF} = 1/K$$

and $$\beta \cong K,$$

then:
$$F = 1 + gm \cdot R \cong gm \cdot R. \quad [13]$$

Because the suppression circuit loop and the loop of the amplifier operate completely independently, it is possible, without reducing the overall circuit stability, to reduce the amount of distortion and noise beyond what can be achieved with conventional feedback measures. Further, if the amplitude of the $V_i$ signal is small, it is possible to replace the DC current sources $I_1$ to $I_4$ with resistors.

Figure 7:
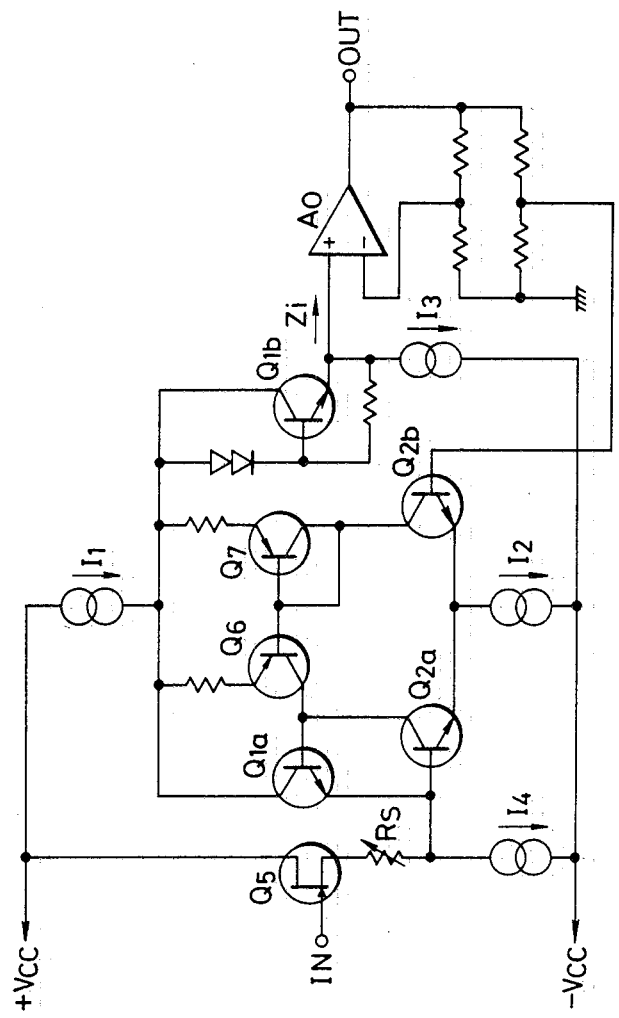
FIG. 7 is a circuit diagram showing a modification of the circuit shown in FIG. 6.

FIG. 7 shows a modification of the circuit of FIG. 6. In this modified circuit arrangement, in place of the resistor load R for the differential amplifier, a current-mirror load circuit composed of transistors $Q_6$ and $Q_7$ is employed. This results in a remarkable increase in loop gain compared to the case of FIG. 6. Moreover, by balancing the differential circuit, the temperature characteristic and discrimination ratio (CMR) is improved. Further, because the voltage loss due to the presence of the resistor is minimized, the dynamic operational range is expanded. In this circuit, $R_s$ is a resistor used for adjustment of DC offset, and the transistor $Q_{1b}$ is used only for DC level shifting. Moreover, the loop gain of the circuit shown in FIG. 7 is substantially determined by the feedback amount, as may be determined from equation [12]. Thus, with the current amplification factor of the transistor $Q_{1a}$ represented as $h_{fe1}$ and the input impedance of the amplifier $A_o$ as $Z_i$, then:

$$F = gm \cdot h_{fe1} \cdot Z_i \qquad [14]$$

This value is large and, consequently, the overall distortion in the circuit is very small.

As is clear from the foregoing description, the invention combines a voltage generator and at least one differential amplifier in an arrangement in which the output of the differential amplifier is added to the voltage generator. The circuit of the invention can accept balanced inputs from second and subsequent input terminals, and thus provides a voltage adder circuit which does not restrict the DC levels of its input signals.

I claim:

1. A voltage adder circuit for adding at least one signal supplied in balanced form to at least one signal supplied in unbalanced form, comprising; at least one differential transistor pair including a load coupled to collectors of each transistor of said pair, said balanced signal being supplied between bases of said transistors of said pair; and an input transistor having a base-collector coupled across at least a portion of one of said loads, said unbalanced signal being applied to an emitter of said input transistor, an output of said circuit being derived from a signal produced at the other one of said loads.

2. The voltage adder circuit of claim 1, wherein a plurality of differential transistor pairs are provided, each transistor of each of said pairs being coupled in parallel with corresponding transistors of other ones of said differential transistor pairs.

3. The voltage adder circuit of claim 2, further comprising a plurality of current sources, one of said current sources being provided for and operationally coupled to a respective one of said differential transistor pairs.

4. The voltage adder circuit of claim 1, further comprising an output transistor having a base-collector coupled across said other one of said loads, and a current source coupled in series with an emitter of said output transistor, a circuit output being taken at said emitter of said output transistor.

5. The voltage adder circuit of claim 1, further comprising a second transistor pair, each transistor of said second transistor pair having a base coupled to the collector and a collector coupled to the emitter of a corresponding one of the transistors of said differential transistor pair and an emitter coupled to an intermediate point of the corresponding load.

6. The voltage adder circuit of claim 1, further comprising a second input transistor and a second at least one differential transistor pair coupled symmetrically and complementarily with said first-mentioned input transistor and differential transistor pair.

7. An amplifier circuit having reduced distortion, comprising: an FET transistor, an input signal being applied to an input electrode of said FET transistor; a differential transistor pair comprising first and second transistors, collectors of transistors of said differential transistor pair being coupled to respective first and second loads; an input transistor having a base-collector coupled across said first load, and an emitter coupled to an output electrode of said FET transistor and to a base of said first transistor of said differential pair; an output transistor having a base-collector coupled in parallel with said second load; first through fourth current sources, said first current source supplying current to commonly connected collectors of said input transistor and said output transistors, said second current source receiving current from commonly connected emitters of said transistors of said differential transistor pair, said third current source receiving current from an emitter of said output transistor, and said fourth current source receiving current from said emitter of said input transistor; an operational amplifier having a noninverting input coupled to said emitter of said output transistor; and a resistor feedback network for providing a feedback signal to a base of said second transistor of said differential transistor pair.

8. The amplifier circuit of claim 7, wherein said first and second loads each comprise resistor means.

9. A voltage adder circuit for adding at lease one signal supplied in balanced form to at least one signal supplied in unbalanced form, comprising:
at least one differential transistor pair including a load coupled to collectors of each transistor of said pair, said balanced signal being supplied between bases of said transistors of said pair; and
an input transistor having a base-collector coupled across at least a portion of one of said loads, said unbalanced signal being applied to an emitter of said input transistor, an output of said circuit being derived from a signal produced at both of said loads,
both of said loads together comprising a current mirror circuit.

* * * * *